(12) United States Patent
Ji

(10) Patent No.: US 9,548,162 B2
(45) Date of Patent: Jan. 17, 2017

(54) CAPACITOR, MEMS DEVICE, AND METHOD OF MANUFACTURING THE MEMS DEVICE

(71) Applicant: LG INNOTEK CO., LTD., Seoul (KR)

(72) Inventor: Chil Young Ji, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 203 days.

(21) Appl. No.: 14/367,767

(22) PCT Filed: Oct. 10, 2012

(86) PCT No.: PCT/KR2012/008205
§ 371 (c)(1),
(2) Date: Jun. 20, 2014

(87) PCT Pub. No.: WO2013/094860
PCT Pub. Date: Jun. 27, 2013

(65) Prior Publication Data
US 2014/0347781 A1    Nov. 27, 2014

(30) Foreign Application Priority Data
Dec. 20, 2011    (KR) .................. 10-2011-0138726

(51) Int. Cl.
*H01G 5/16* (2006.01)
*H01G 5/38* (2006.01)
*H01L 27/01* (2006.01)
*H01L 49/02* (2006.01)

(52) U.S. Cl.
CPC .................. *H01G 5/16* (2013.01); *H01G 5/38* (2013.01); *H01L 27/016* (2013.01); *H01L 28/40* (2013.01); *Y10T 29/43* (2015.01)

(58) Field of Classification Search
CPC .................................... H01G 5/16; H01G 5/38
See application file for complete search history.

(56) References Cited

U.S. PATENT DOCUMENTS

| | | | | |
|---|---|---|---|---|
| 5,627,316 | A * | 5/1997 | De Winter | G01C 9/10 200/61.45 R |
| 5,992,233 | A * | 11/1999 | Clark | G01C 19/5719 361/280 |
| 6,441,449 | B1 * | 8/2002 | Xu | H01G 5/16 257/312 |
| 6,836,193 | B1 * | 12/2004 | Kim | H03B 5/00 331/16 |
| 6,893,672 | B2 * | 5/2005 | Ingraham | B32B 7/06 426/107 |

(Continued)

FOREIGN PATENT DOCUMENTS

| | | |
|---|---|---|
| JP | 2006-326806 A | 12/2006 |
| KR | 10-0599115 B1 | 7/2006 |
| KR | 10-2007-0095445 A | 9/2007 |

OTHER PUBLICATIONS

International Search Report in International Application No. PCT/KR2012/008205, filed Oct. 10, 2012.

*Primary Examiner* — David M Sinclair
(74) *Attorney, Agent, or Firm* — Saliwanchik, Lloyd & Eisenschenk

(57) ABSTRACT

Disclosed is a capacitor. The capacitor includes a plurality of capacitor units connected to each other in parallel. The capacitor unit includes a first capacitor, a second capacitor connected to the first capacitor in parallel, and a switch selectively connected to the first capacitor or the second capacitor.

16 Claims, 4 Drawing Sheets

(56) References Cited

U.S. PATENT DOCUMENTS

| | | | |
|---|---|---|---|
| 7,141,989 B1* | 11/2006 | Liu | H01G 5/014 |
| | | | 257/312 |
| 8,044,701 B1 | 10/2011 | Greenberg | |
| 2004/0214543 A1* | 10/2004 | Osone | H01G 5/16 |
| | | | 455/197.2 |
| 2006/0017125 A1 | 1/2006 | Lee et al. | |
| 2006/0170506 A1 | 8/2006 | Youssoufian et al. | |
| 2006/0226735 A1* | 10/2006 | Ikehashi | H01G 5/18 |
| | | | 310/311 |
| 2006/0267109 A1 | 11/2006 | Ohguro | |
| 2007/0063788 A1* | 3/2007 | Zhu | H03H 7/38 |
| | | | 333/32 |
| 2008/0247115 A1* | 10/2008 | Lee | H01L 27/016 |
| | | | 361/277 |
| 2009/0009925 A1 | 1/2009 | Hilgers | |
| 2010/0134195 A1* | 6/2010 | Lee | H03B 5/1228 |
| | | | 331/117 FE |
| 2010/0231326 A1* | 9/2010 | Ziaei | H01G 5/40 |
| | | | 333/174 |
| 2010/0315757 A1* | 12/2010 | Yamazaki | H01G 5/16 |
| | | | 361/290 |
| 2013/0342954 A1* | 12/2013 | Shimanouchi | H01G 5/16 |
| | | | 361/290 |

\* cited by examiner

CAPACITOR, MEMS DEVICE, AND METHOD OF MANUFACTURING THE MEMS DEVICE

CROSS-REFERENCE TO RELATED APPLICATIONS

This application is the U.S. national stage application of International Patent Application No. PCT/KR2012/008205, filed Oct. 10, 2012, which claims priority to Korean Application No. 10-2011-0138726, filed Dec. 20, 2011, the disclosures of each of which are incorporated herein by reference in their entirety.

TECHNICAL FIELD

The embodiment relates to a capacitor, a MEMS device, and a method of manufacturing the MEMS device.

BACKGROUND ART

Communication equipment requires various frequency bands when operating. To this end, the communication equipment must include devices for generating and processing (amplifying) frequencies. The devices for generating and processing (amplifying) frequencies may be realized by using crystal and LC resonance circuits.

The frequencies generated by the LC resonance circuit vary depending on an inductor L and a capacitor C. Therefore, various frequencies may be generated by adjusting the inductor L and the capacitor C in the LC resonance circuit. In most of cases, the frequencies are changed by adjusting the capacitor C in the LC resonance circuit.

Therefore, researches and studies on a scheme of continuously or discretely varying a capacitance by using micro electro mechanical systems (MEMS) have been variously performed. In particular, researches and studies of varying the capacitance and the inductance through the continuous mechanical displacement of a driving unit of the MEMS have been performed.

DISCLOSURE OF INVENTION

Technical Problem

The embodiment provides a capacitor capable of easily adjusting the capacitance thereof.

Solution to Problem

According to the embodiment, there is provided a variable capacitor including a plurality of capacitor units connected to each other in parallel. The capacitor unit includes a first capacitor, a second capacitor connected to the first capacitor in parallel, and a switch selectively connected to the first capacitor or the second capacitor.

According to the embodiment, there is provided a capacitor including a substrate, a third capacitor electrode on the substrate, a first capacitor electrode provided on the substrate and spaced apart from the third capacitor electrode, a second capacitor electrode opposite to the first capacitor electrode and spaced apart from the first capacitor electrode and the third capacitor electrode, a movable electrode between the first and second capacitor electrodes, and a driving electrode to move the movable electrode.

According to the embodiment, there is provided a capacitor including a substrate, a connection electrode on the substrate, a first capacitor electrode provided on the substrate and spaced apart from the connection electrode, a second capacitor electrode opposite to the first capacitor electrode and spaced apart from the first capacitor electrode, a movable electrode between the first and second capacitor electrodes, and a driving electrode to move the movable electrode.

Advantageous Effects of Invention

As described above, according to the variable capacitor of the embodiment, the capacitance of one capacitor unit can be properly adjusted by selectively connecting two capacitors. As described above, the variable capacitor having the capacitance varying in the wide range can be realized by using a plurality of capacitor units.

In other words, the capacitor unit can adjust the capacitance thereof by using the movable electrode. In other words, the movable electrode can perform a switch function while performing the function of the capacitor electrode. Therefore, according to the variable capacitor of the embodiment, two capacitors are integrated with each other in small space, thereby constructing the capacitor unit.

Therefore, the variable capacitor according to the embodiment can represent high variable precision in a small size.

MODE FOR THE INVENTION

In the description of the embodiments, it will be understood that, when a panel, a sheet, a member, a guide, or a unit is referred to as being "on" or "under" another panel, another sheet, another member, another guide, or another unit, it can be "directly" or "indirectly" on the other panel, the other sheet, the other member, the other guide, or the other unit, or one or more intervening components may also be present. Such a position of the component has been described with reference to the drawings.

Figure 1:
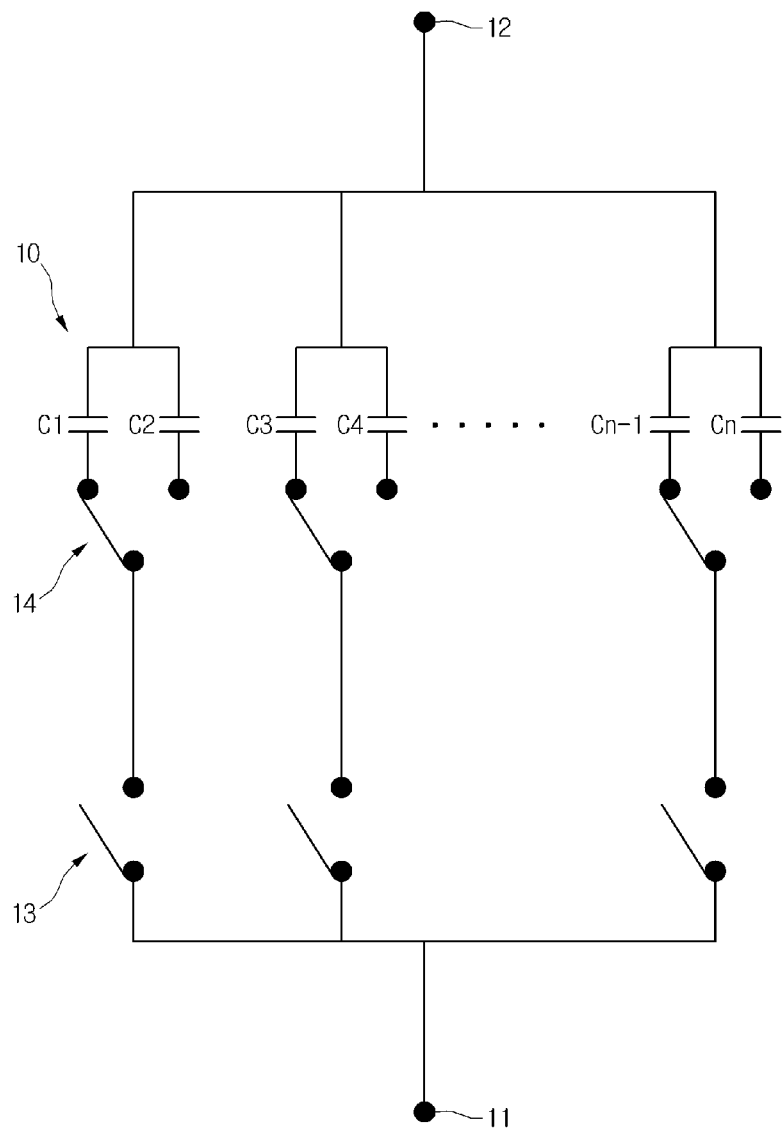
FIG. 1 is a circuit diagram showing a capacitor according to the embodiment.
Figure 2:
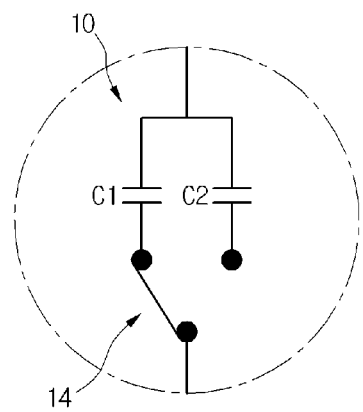
FIG. 2 is a circuit diagram showing one capacitor unit.
Figure 3:
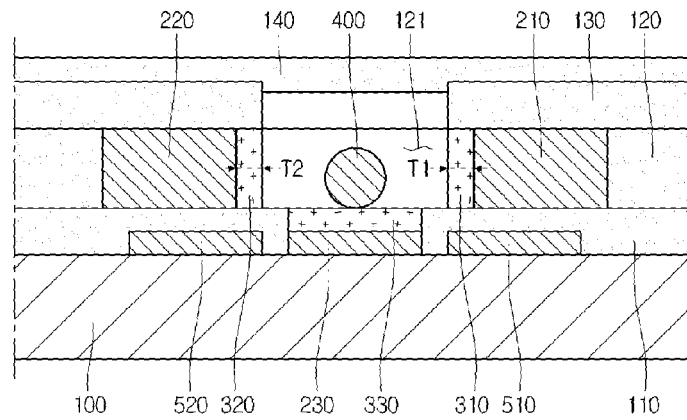
FIG. 3 is a sectional view showing a variable capacitor according to the embodiment.

FIG. 1 is a circuit diagram showing a capacitor according to the embodiment, FIG. 2 is a circuit diagram showing one capacitor unit, and FIG. 3 is a sectional view showing a variable capacitor according to the embodiment.

Referring to FIGS. 1 to 3, the variable capacitor according to the embodiment includes a plurality of capacitor units 10, a plurality of on/off switches 13, an input terminal 11, and an output terminal 12.

The capacitor units 10 may be connected to each other in parallel. The capacitor units 10 may have two capacitances. In addition, the capacitor units 10 may be connected to the input terminal 11 and the output terminal 12.

The on/off switches 13 are connected to the capacitor units 10, respectively. In other words, the on/off switches 13 are series connected to the capacitor units 10 in one-to-one correspondence. The on/off switches 13 connect the capacitor units 10 to the input terminal 11 or the output terminal 12, or disconnect the capacitor units 10 from the input terminal 11 or the output terminal 12.

The input terminal 11 is connected to the capacitor units 10. Signals are input to the capacitor units 10 through the input terminal 11.

The output terminal 12 is connected to the capacitor units 10. Signals filtered by the capacitor units 10 may be output through the output terminal 12.

Referring to FIG. 2, each capacitor unit 10 includes two capacitors C1 and C2, and a selection switch 14.

The capacitor unit 10 may include the first and second capacitors C1 and C2. The first and second capacitors C1 and C2 may be connected to each other in parallel.

The selection switch 14 may be selectively connected to the first capacitor C1 or the second capacitor C2. In other words, the selection switch 14 may be connected to only the first capacitor C1 or only the second capacitor C2.

The selection switch 14 selectively connects the first capacitor C1 or the second capacitor C2 to the input terminal 11. In other words, the selection switch 14 may connect only the first capacitor C1 or only the second capacitor C2 to the input terminal 11. The selection switch 14 may connect only one of the first and second capacitors C1 and C2 to the input terminal 11.

Differently from FIGS. 1 and 2, the selection switch 14 may connect the first capacitor C1 or the second capacitor C2 to the output terminal 12. In other words, the selection switch 14 may connect only the first capacitor C1 or only the second capacitor C2 to the output terminal 12. In other words, the selection switch 14 may connect only one of the first and second capacitors C1 and C2 to the input terminal 11.

The first capacitor C1 may have a capacitance different from that of the second capacitor C2. In this case, the difference between the capacitances of the first and second capacitors C1 and C2 may be in the range of about 10 fF to about 100 fF. In addition, the capacitance of the first capacitor C1 may be in the range of about 50 fF to about 150 fF. In addition, the capacitance of the second capacitor C2 may be in the range of about 50 fF to about 150 fF.

Therefore, the capacitor unit 10 may have two capacitances. In other words, the capacitor unit 10 may have the capacitance of the first capacitor C1 or the capacitance of the second capacitor C2.

Referring to FIG. 3, the variable capacitor according to the embodiment includes a substrate 100, a first capacitor electrode 210, a second capacitor electrode 220, a third capacitor electrode 230, a first dielectric part 310, a second dielectric part 320, a third dielectric part 330, a movable electrode 400, a first driving electrode 510, and a second electrode 520.

The substrate 100 supports the first to third capacitor electrodes 210 to 230, the first to third dielectric parts 310 to 330, the movable electrode 400, the first and second driving electrodes 510 and 520, and a plurality of insulating layers 110, 120, 130, and 140.

The substrate 100 includes an insulator. The substrate 100 may include a silicon substrate, a glass substrate, or a plastic substrate.

The first and second capacitor electrodes 210 and 220 are provided on the substrate 100. In more detail, the first and second capacitor electrodes 210 and 220 are provided on the first insulating layer 110.

The first and second capacitor electrodes 210 and 220 are spaced apart from each other. A predetermined space is formed between the first and second electrodes 210 and 220. The first capacitor electrode 210 may be provided in opposition to the second capacitor electrode 220.

The third capacitor electrode 230 is provided on the substrate 100. In addition, the third capacitor electrode 230 is provided below the movable electrode 400. The third capacitor electrode 230 is interposed between the first and second capacitor electrodes 210 and 220.

The third capacitor electrode 230 is spaced apart from the first capacitor electrode 210. In addition, the third capacitor electrode 230 is spaced apart from the second capacitor electrode 220. The first insulating layer 110 is interposed between the third capacitor electrode 230 and the first capacitor electrode 210. In addition, the first insulating layer 110 is interposed between the third and second capacitor electrodes 230 and 220.

The first insulating layer 110 is provided on the substrate 100. The first insulating layer 110 covers the first and second driving electrodes 510 and 520. The top surface of the first insulating layer 100 may have a flat surface.

The first dielectric part 310 is provided at one lateral side of the first capacitor electrode 210. The first dielectric part 310 is provided on the first insulating layer 110. The first dielectric part 310 is interposed between the first capacitor electrode 210 and the movable electrode 400.

The second dielectric part 320 is provided at one lateral side of the second capacitor electrode 220. The second dielectric part 320 is provided on the first insulating layer 110. The second dielectric part 320 is interposed between the second capacitor electrode 220 and the movable electrode 400.

A thickness T1 of the first dielectric part 310 is different from a thickness T2 of the second dielectric part 320. In this case, the thickness T1 of the first dielectric part 310 refers to a distance between a surface of the first dielectric part 310 making contact with the first capacitor electrode 210 and a surface of the first dielectric part 310 directly facing the movable electrode 400. Similarly, the thickness T2 of the second dielectric part 320 refers to a distance between a surface of the second dielectric part 320 making contact with the second capacitor electrode 220 and a surface of the second dielectric part 320 directly facing the movable electrode 400.

The third dielectric part 330 is provided on the third capacitor electrode 230. In more detail, the third dielectric part 330 is interposed between the third capacitor electrode 230 and the movable electrode 400. The third dielectric part 330 may cover the entire top surface of the third capacitor electrode 230.

The first to third dielectric parts 310 to 330 may include materials representing high permittivity. For example, the first to third dielectric parts 310 to 330 may include a material such as titanium oxide, iridium oxide, or a ruthenium oxide.

The movable electrode 400 is provided on the substrate 100. The movable electrode 400 is provided in a receiving groove 121 formed in the second insulating layer 120. The movable electrode 400 is provided on the third capacitor electrode 230. In more detail, the movable electrode 400 is provided on the third dielectric part 330. The movable electrode 400 may make contact with the top surface of the third dielectric part 330.

The movable electrode 400 is interposed between the first and second capacitor electrodes 210 and 220. In other words, the first and second capacitor electrodes 210 and 220 face each other while interposing the movable electrode 400 therebetween.

In addition, the movable electrode 400 is interposed between the first and second dielectric parts 310 and 320. In other words, the first and second dielectric parts 310 and 320 face each other while interposing the movable electrode 400 therebetween.

In addition, the movable electrode 400 may directly make contact with the first dielectric part 310 or the second dielectric part 320. The movable electrode 400 selectively makes contact with the first dielectric part 310 or the second dielectric part 320. In other words, the movable electrode 400 may make contact with only one of the first and second dielectric parts 310 and 320. In more detail, the movable electrode 400 may directly make contact with the first dielectric part 310, or may move, be spaced apart from the first dielectric part 310, and directly make contact with the second dielectric part 320.

The movable electrode 400 may have a spherical shape. In addition, the movable electrode 400 may have a cylindrical shape.

The movable electrode 400 has a diameter in the range of about 1 µm to about 10 µm. When the movable electrode 400 has the cylindrical shape, the length of the movable electrode 400 may be determined according to the width of the receiving groove 121.

The diameter of the movable electrode 400 may vary depending on the interval between the first and second dielectric parts 310 and 320. In more detail, the diameter of the movable electrode 400 may be less than the interval between the first and second dielectric parts 310 and 320. In more detail, the diameter of the movable electrode 400 may be about ⅕ to about ⅔ of the interval between the first and second dielectric parts 310 and 320.

The interval between the first and second dielectric parts 310 and 320 may be in the range of about 5 µm to about 15 µm.

The second insulating layer 120 is provided on the first insulating layer 110. The second insulating layer 120 insulates the lateral sides of the first and second capacitor electrodes 210 and 220. In addition, the receiving groove 121 is formed in the second insulating layer 120.

The first driving electrode 510 is provided in the substrate 100. The first driving electrode 510 is adjacent to the first capacitor electrode 210. In addition, the first driving electrode 510 is adjacent to the receiving groove 121. In addition, the first driving electrode 510 is adjacent to the third capacitor electrode 230. In addition, the first driving electrode 510 may be provided corresponding to the first capacitor electrode 210.

In addition, the first driving electrode 510 may be provided below the first capacitor electrode 210. The first insulating layer 110 may be interposed between the first driving electrode 510 and the first capacitor electrode 210. In addition, the first driving electrode 510 may be provided beside the third capacitor electrode 230. The first insulating layer 110 may be interposed between the first driving electrode 510 and the third driving electrode.

The second driving electrode 520 is provided in the substrate 100. The second driving electrode 520 is adjacent to the second capacitor electrode 220. In addition, the second driving electrode 520 is adjacent to the receiving groove 121. In addition, the second driving electrode 520 is adjacent to the third capacitor electrode. In addition, the second driving electrode 520 may be provided corresponding to the second capacitor electrode 220.

In addition, the second driving electrode 520 may be provided below the second capacitor electrode 220. The first insulating layer 110 may be interposed between the second driving electrode 520 and the second capacitor electrode 220. In addition, the second driving electrode 520 may be provided beside the third capacitor electrode 230. The first insulating layer 110 may be interposed between the second driving electrode 520 and the third driving electrode.

The first and second driving electrodes 510 and 520 drive the movable electrode 400. In more detail, the first and second driving electrodes 510 and 520 may move the movable electrode 400. In detail, the first driving electrode 510 can move the movable electrode 400 in the direction of the first dielectric part 310 due to electrostatic attraction. In addition, the second driving electrode 520 can move the movable electrode 400 in the direction of the second dielectric part 320 due to the electrostatic attraction.

The third insulating layer 130 is provided on the second insulating layer 120. The second insulating layer 120 covers the first and second capacitor electrodes 210 and 220. The second insulating layer 120 may insulate top surfaces of the first and second capacitor electrodes 210 and 220.

The fourth insulating layer 140 is provided on the third insulating layer 130. The fourth insulating layer 140 covers the receiving groove 121. The fourth insulating layer 140 may include resin representing high viscosity. In addition, the fourth insulating layer 140 may include a porous oxide layer. The fourth insulating layer 140 includes a capping part to cover the receiving groove 121. The fourth insulating layer 140 can prevent the movable electrode 400 from being moved out of the receiving groove 121.

The first to third capacitor electrodes 210 to 230, the movable electrode 400, and the first and second driving electrodes 510 and 520 may include conductors. In more detail, the first to third capacitor electrodes 210 to 230, the movable electrode 400, and the first and second driving electrodes 510 and 520 may include a material such as nickel (Ni), copper (Cu), gold (Au), silver (Ag), cobalt (Co), tungsten (W), platinum (Pt), aluminum (Al) or the alloy thereof.

The first to fourth insulating layers 110 to 140 may include insulators. The first to fourth insulating layers 110 to 140 may include a material such as silicon oxide, silicon nitride, or polymer.

As described above, the movable electrode 400 may be driven by the first and second driving electrodes 510 and 520.

When electrostatic attraction is applied to the movable electrode 400 by the first driving electrode 510, the movable electrode 400 is moved closely to the first driving electrode 510. In this case, since the first driving electrode 510 is adjacent the first and third capacitor electrodes 210 and 230, the movable electrode 400 is moved closely to the first capacitor electrode 210 and the third capacitor electrode 230. In this case, the movable electrode 400 may directly make contact with the first dielectric part 310 and the third dielectric part 330.

Therefore, a first sub-capacitance is formed between the first capacitor electrode 210 and the movable electrode 400. In addition, a second sub-capacitance is formed between the third capacitor electrode 230 and the movable electrode 400. Therefore, a first capacitance is formed between the first and second capacitor electrodes 210 and 230. The first capacitance may be formed by the first and second sub-capacitances.

When electrostatic attraction is applied to the movable electrode 400 by the second driving electrode 520, the movable electrode 400 is moved closely to the second driving electrode 520. In this case, since the second driving electrode 520 is adjacent to the second and third capacitor electrodes 220 and 230, the movable electrode 400 is moved closely to the second capacitor electrode 220 and the third capacitor electrode 230. In this case, the movable electrode 400 may directly make contact with the second dielectric part 320 and the third dielectric part 330.

Therefore, a third sub-capacitance is formed between the second capacitor electrode 220 and the movable electrode 400. In addition, a fourth sub-capacitance is formed between the third capacitor electrode 230 and the movable electrode 400. Therefore, a second capacitance is formed between the second and third capacitor electrodes 220 and 230. The second capacitance may be formed by the third and fourth sub-capacitances.

As described above, by the first and second driving electrodes 510 and 520, the first capacitance may be formed between the first capacitor electrode 210 and the third capacitor electrode 230, or the second capacitance may be formed between the second capacitor electrode 220 and the third capacitor electrode 230.

In this case, the first and second capacitor electrodes 210 and 220 may be connected to the output terminal 12, and the third capacitor electrode 230 may be connected to the input terminal 11. In other words, the first capacitor electrode 210, the first dielectric part 310, the movable electrode 400, the third dielectric part 330, and the third capacitor electrode 230 may constitute the first capacitor C1. In addition, the second capacitor electrode 220, the second dielectric part 320, the movable electrode 400, the third dielectric part 330, and the third capacitor electrode 230 may constitute the second capacitor C2. In addition, the movable electrode 400, the first driving electrode 510, and the second driving electrode 520 may constitute the selection switch 14.

As described above, the variable capacitor according to the embodiment can properly adjust the capacitance of one capacitor unit 10 by selectively connecting the two capacitors C1 and C2. Accordingly, a variable capacitor having variable capacitances can be realized by using the capacitor units 10.

In particular, the capacitor units 10 can adjust the capacitance by using the movable electrode 400. In other words, the movable electrode 400 can perform a switching function while performing a capacitor electrode function. Therefore, two capacitors C1 and C2 can be integrated in a small space in order to form the capacitor unit 10. In other words, one capacitor unit 10 has two capacitances.

Therefore, the variable capacitor according to the embodiment may have a small size and high variable precision.

FIGS. 4 to 10 are sectional views showing the fabricating process of the variable capacitor according to the embodiment. Hereinafter, the method of fabricating the variable capacitor will be described by making reference to the above description of the variable capacitor. In other words, the above description of the variable capacitor will be incorporated in the description of the method of fabricating the variable capacitor.

Figure 4:
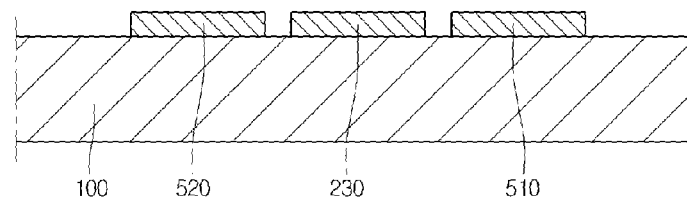
FIGS. 4 to 10 are sectional views showing a method of fabricating the variable capacitor according to the embodiment.

Referring to FIG. 4, the third capacitor electrode 230, the first driving electrode 510, and the second driving electrode 520 are formed on the substrate 100. The third capacitor electrode 230 is interposed between the first driving electrode 510 and the second driving electrode 520.

Figure 5:
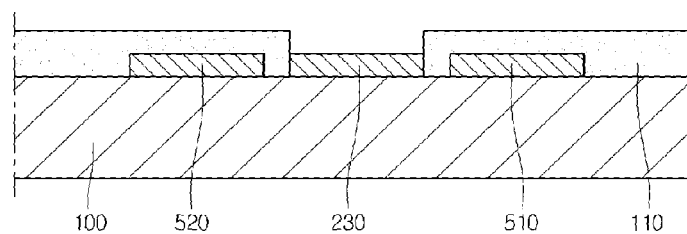

Referring to FIG. 5, the first insulating layer 110 is formed on the substrate 100. The first insulating layer 110 can expose the top surface of the third capacitor electrode 230. In other words, the first insulating layer 110 includes a groove to expose the third capacitor electrode 230.

Figure 6:
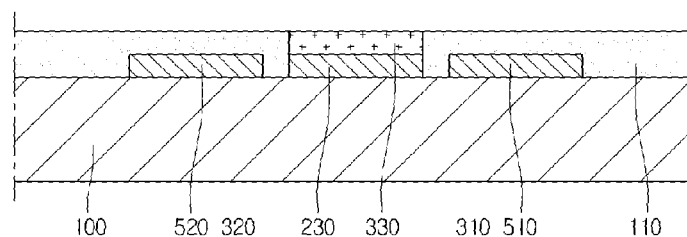

Referring to FIG. 6, the first dielectric part 310 is formed by deposing a material representing a high dielectric property on the first insulating layer 110 and inside the groove and performing a chemical mechanical polishing process (CMP) process with respect to the resultant structure.

Figure 7:
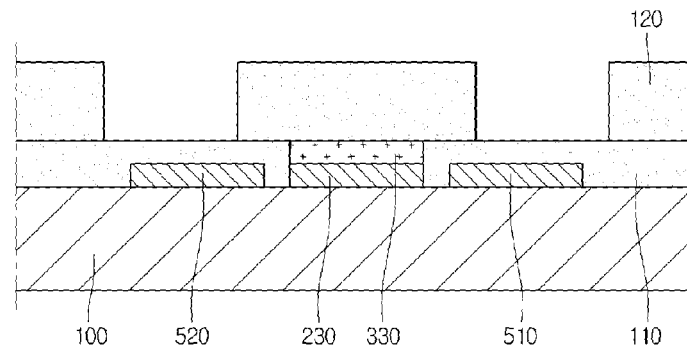

Referring to FIG. 7, the second insulating layer 120 is formed on the first insulating layer 110. Then, the second insulating layer 120 is formed therein with grooves.

Figure 8:
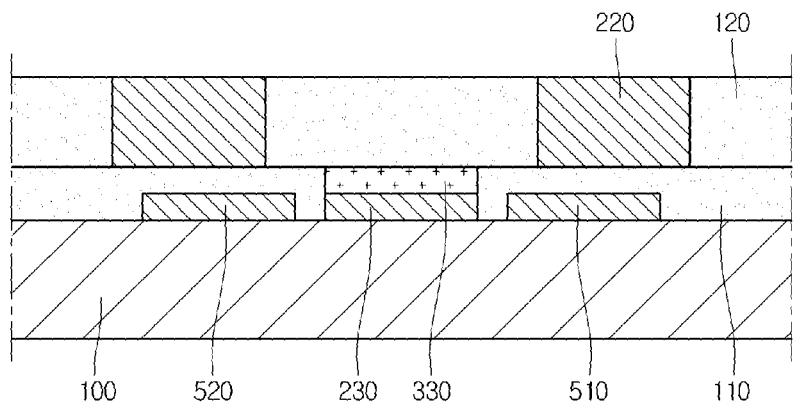

Referring to FIG. 8, the first and second capacitor electrodes 210 and 220 are formed by depositing a conductive material in the grooves formed in the second insulating layer 120, and polishing the top surface of the second insulating layer 120 and the conductive material through the CMP process.

Figure 9:
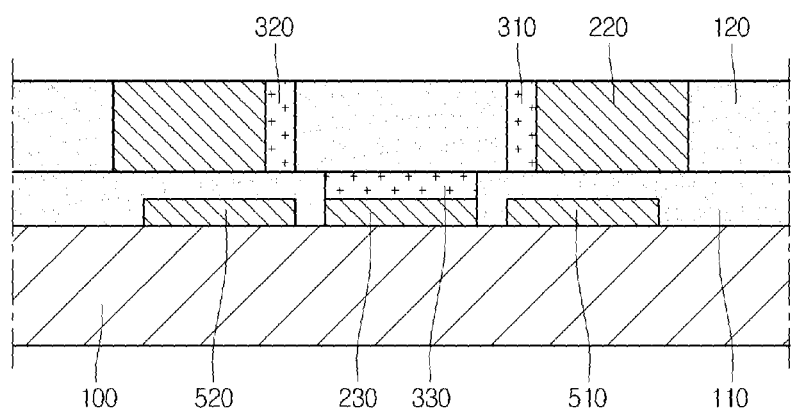

Referring to FIG. 9, the first and second dielectric parts 310 and 320 are formed by removing portions of the second insulating layer 120 adjacent to the first and second capacitor electrodes 210 and 220, depositing a high dielectric material at the removed portions, and performing the CMP process with respect to the resultant structure.

Figure 10:
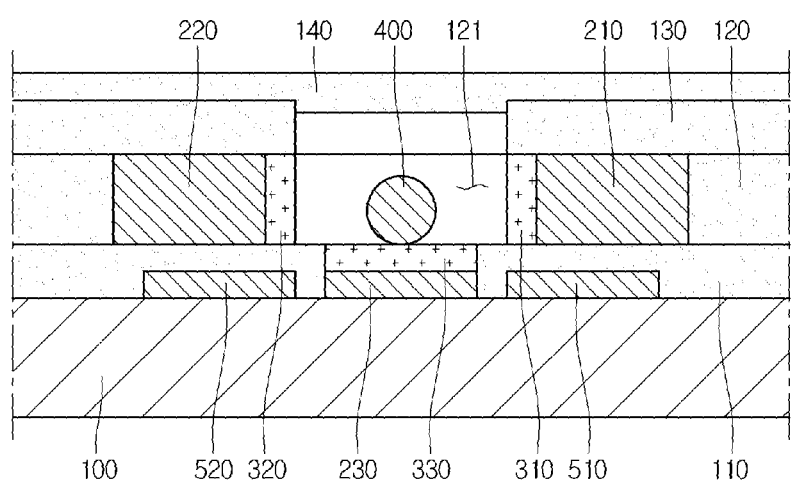

Referring to FIG. 10, the receiving groove 121 is formed by removing a portion of the second insulating layer 120.

Thereafter, the third insulating layer 130 is formed on the second insulating layer 120, and the movable electrode 400 is provided in the receiving groove 121.

Thereafter, the fourth insulating layer 140 is formed to cover the receiving groove 121. In order to form the fourth insulating layer 140, resin composition representing high viscosity is coated on the third insulating layer 130. Since the resin composition represents high viscosity, the resin composition is not infiltrated into the receiving groove 121.

Thereafter, the resin composition is hardened, so that the fourth insulating layer 140 may be formed.

In addition, the movable electrode 400 and the fourth insulating layer 140 may be formed through various schemes.

After the third insulating layer 130 has been formed, a metallic oxide is filled in the receiving groove 121. Thereafter, an insulating film having pores may be formed on the metallic oxide and the third insulating layer 130. Thereafter, the metallic oxide in the receiving groove 121 is reduced at a high temperature, and the metal contained in the metallic oxide can constitute the movable electrode 400 having a circular shape.

As described above, the variable capacitor having a small size and the high variable precision can be formed.

Figure 11:
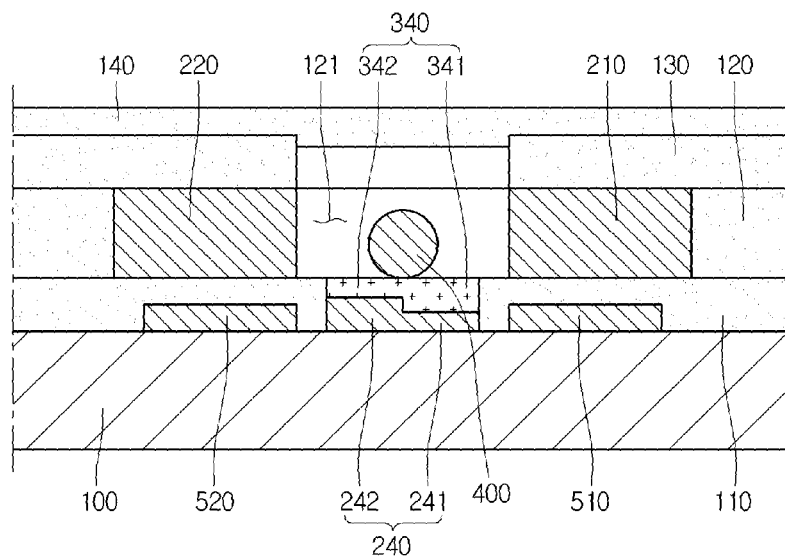
FIG. 11 is a sectional view showing a variable capacitor according to another embodiment.

FIG. 11 is a sectional view showing a variable capacitor according to another embodiment. Hereinafter, the present embodiment will be described by making reference to the above description of the variable capacitor and the fabricating method of the variable capacitor. The above description of the variable capacitor and the fabricating method of the variable capacitor will be incorporated in the description of the variable capacitor according to the present embodiment except for modifications.

Referring to FIG. 11, the variable capacitor according to the present embodiment includes a fourth capacitor 240 and a fourth dielectric part 340.

The fourth capacitor electrode 240 may have a step difference. In other words, the fourth capacitor electrode 240 may have the shape of a stair. The fourth capacitor electrode 240 includes a first sub-electrode part 241 and a second sub-electrode part 242. The first sub-electrode part 241 may have a thickness thinner than that of the second sub-electrode part 24. The first sub-electrode part 241 may be integrally formed with the second sub-electrode part 242.

The fourth dielectric part 340 is provided on the fourth capacitor electrode 240. The fourth dielectric part 340 may have a step difference. In this case, the fourth dielectric part 340 may have a flat top surface, and a step-shaped bottom surface. The first dielectric part 340 includes first and second sub-electric parts 341 and 342.

The first sub-dielectric part 341 directly makes contact with the first sub-dielectric part 241. The first sub-dielectric part 341 is directly provided on the top surface of the first sub-electrode part 241.

The second sub-dielectric part 342 directly makes contact with the second sub-dielectric part 242. The second sub-dielectric part 342 is directly provided on the top surface of the first sub-electrode part 242.

The first sub-dielectric part 341 is thicker than the second sub-dielectric part 342. In addition, the first sub-dielectric part 341 is adjacent to the first capacitor 210, and the second sub-dielectric part 342 is adjacent to the second capacitor electrode 220.

In addition, the first capacitor electrode 210 may directly make contact with the movable electrode 400. In addition, the second capacitor electrode 220 may directly make contact with the movable electrode 400. In other words, the first and second dielectric parts 310 and 320 according to the previous embodiment are omitted from the present embodiment.

In addition, when the movable electrode 400 makes contact with the first capacitor electrode 210, a first capacitance may be formed by the movable electrode 400, the first sub-dielectric part 341, and the first sub-electrode part 241. In addition, a second capacitance may be formed by the movable electrode 400, the second sub-dielectric part 342, and the second sub-electrode part 242.

As described above, the variable capacitor according to the present embodiment includes a capacitor unit 10 having two capacitances by using one dielectric part. Accordingly, the variable capacitor according to the present embodiment will be easily fabricated. In addition, in the variable capacitor according to the present embodiment, the number of the used dielectric parts is reduced, so that errors can be reduced throughout the whole fabricating processes.

Figure 12:
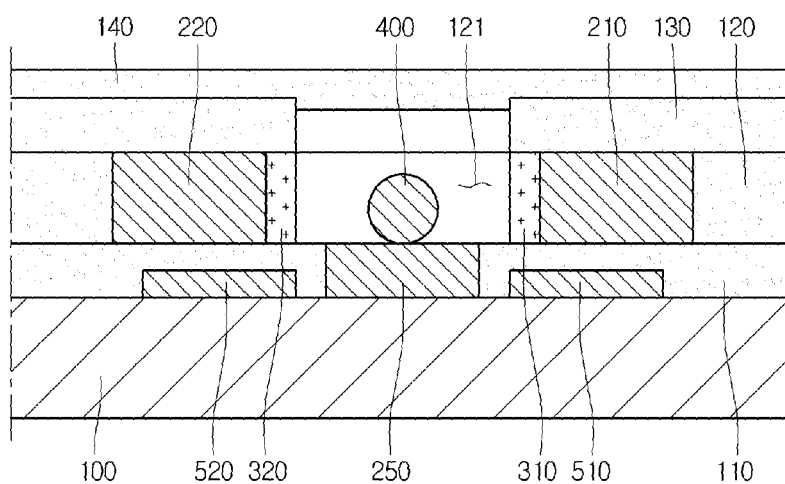
FIG. 12 is a sectional view showing a variable capacitor according to still another embodiment.

FIG. 12 is a sectional view showing a variable capacitor according to still another embodiment. Hereinafter, the present embodiment will be described by making reference to the above description of the variable capacitor and the fabricating method of the variable capacitor. In other words, the above description of the variable capacitor and the fabricating method of the variable capacitor will be incorporated in the description of the variable capacitor according to the present embodiment except for modifications.

Referring to FIG. 12, the capacitor according to the present embodiment includes a connection electrode 250. The connection electrode 250 is provided on the substrate 100. In addition, the connection electrode 250 is exposed to the bottom surface of the receiving groove 121. In other words, the first insulating layer 110 may expose the top surface of the connection electrode 250. In addition, the second insulating layer 120 exposes the top surface of the connection electrode 250. In other words, the top surface of the connection electrode 250 may be exposed by the receiving groove 121.

The connection electrode 250 is interposed between the first and second driving electrodes 510 and 520. In addition, the connection electrode 250 is spaced apart from the first and second capacitor electrodes 210 and 220. The connection electrode 250 is provided at a region between the first and second capacitor electrodes 210 and 220.

The connection electrode 250 directly makes contact with the movable electrode 400. In other words, a dielectric part is not between the connection electrode 250 and the movable electrode 400.

Therefore, when the movable electrode 400 makes contact with the connection electrode 250 and the first dielectric part 310, a first capacitance is formed by the movable electrode 400, the first dielectric part 310, and the first capacitor electrode 210. In addition, when the movable electrode 400 makes contact with the connection electrode 250 and the second dielectric part 320, a second capacitance is formed by the movable electrode 400, the second dielectric part 320, and the first capacitor electrode 220.

As described above, the variable capacitor according to the present embodiment includes the capacitor unit 10 having two capacitances by using two dielectric parts. Accordingly, the variable capacitor according to the present embodiment will be easily fabricated. In addition, in the variable capacitor according to the present embodiment, the number of the used dielectric parts is reduced, so that errors can be reduced throughout the whole fabricating processes.

Figure 13:
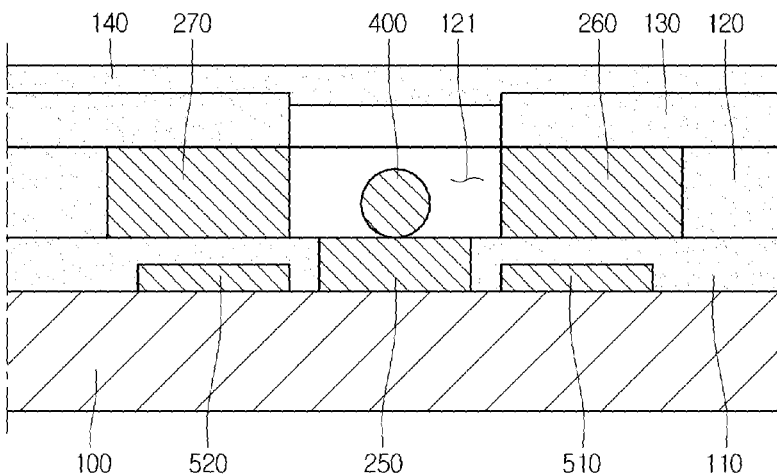
FIG. 13 is a sectional view showing a switch device according to still another embodiment.

FIG. 13 is a sectional view showing a switch device according to still another embodiment. Hereinafter, the present embodiment will be described by making reference to the above description of the variable capacitor and the fabricating method of the variable capacitor. In other words, the above description of the components of the variable capacitor and the fabricating method of the variable capacitor will be incorporated in the description of the switch device according to the present embodiment except for modifications.

Referring to FIG. 13, the switch device according to the present embodiment includes a first connection electrode 260, a second connection electrode 270, and a third connection electrode 250.

A different material is not interposed between the first connection electrode 260 and the movable electrode 400. In addition, a different material is not interposed between the second connection electrode 270 and the movable electrode 400. A different material is not interposed between the third connection electrode 250 and the movable electrode 400.

Therefore, the movable electrode 400 may directly make contact with the first connection electrode 260. In addition, the movable electrode 400 may directly make contact with the second connection electrode 270. In addition, the movable electrode 400 may directly make contact with the third connection electrode 250.

Therefore, the movable electrode 400 is moved by the driving of the first driving electrode 510, so that the movable electrode 400 can be connected to the first and third connection electrodes 260 and 250. Therefore, the first connection electrode 260 is electrically connected to the third connection electrode 250, and the second connection electrode 270 may be disconnected from the third connection electrode 250.

In addition, the movable electrode 400 is moved by the driving of the second driving electrode 520 so that the movable electrode 400 can be connected to the second and third connection electrodes 270 and 250. Therefore, the second connection electrode 270 is electrically connected to the third connection electrode 250, and the first connection electrode 260 may be disconnected from the third connection electrode 250.

As described above, the movable electrode 400, the first driving electrode 510, and the second driving electrode 520 can perform a switching function. In other words, the movable electrode 400 selectively connects the third connection electrode 250 to the first connection electrode 260 or the second connection electrode 270.

The switch device according to the present embodiment is applicable to a memory device.

The variable capacitor and the switch device according to the above embodiments may correspond to the MEMS device realized through a MEMS technology.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A variable capacitor comprising
an input terminal;
an output terminal;
a plurality of capacitor units interposed between the input terminal and the output terminal, and connected to each other in parallel; and
a plurality of on/off switches connected to the capacitor units, respectively, and connecting the capacitor units to the output terminal,
wherein each of the capacitor units comprises:
a first capacitor;
a second capacitor connected to the first capacitor in parallel; and
a selection switch connecting the first capacitor to the output terminal in a first state and connecting the second capacitor to the output terminal in a second state.

2. The variable capacitor of claim 1, wherein each of the first and second capacitors has a capacitance in a range of 50 fF to 150 fF.

3. The variable capacitor of claim 1, wherein a capacitance of the first capacitor is different from a capacitance of the second capacitor.

4. The variable capacitor of claim 1, wherein each capacitor unit comprises:
a substrate;
a movable electrode on the substrate; and
a driving electrode to drive the movable electrode.

5. The variable capacitor of claim 4, wherein the movable electrode has a ball shape.

6. The variable capacitor of claim 4, wherein each capacitor unit comprises:
a first capacitor electrode forming a first capacitance together with the movable electrode; and
a second capacitor electrode forming a second capacitance together with the movable electrode.

7. The variable capacitor of claim 6, wherein the capacitor unit further comprises a connection electrode connected to the movable electrode.

8. A capacitor comprising:
a substrate;
a third capacitor electrode on the substrate;
a first capacitor electrode provided on the substrate while being spaced apart from the third capacitor electrode;
a second capacitor electrode opposite to the first capacitor electrode while being spaced apart from the first capacitor electrode and the third capacitor electrode;
a movable electrode between the first and second capacitor electrodes;
a driving electrode to move the movable electrode; and
an insulating layer on the substrate,
wherein the insulating layer is provided therein with a receiving groove to expose the third capacitor electrode, and the movable electrode is received in the receiving groove.

9. The capacitor of claim 8, further comprising:
a first dielectric member between the first capacitor electrode and the movable electrode; and
a second dielectric member between the first capacitor electrode and the movable electrode.

10. The capacitor of claim 9, wherein a thickness of the first dielectric member is different from a thickness of the second dielectric member.

11. The capacitor of claim 8, wherein the driving electrode comprises:
a first driving electrode adjacent to the first capacitor electrode; and
a second driving electrode adjacent to the second capacitor electrode.

12. The capacitor of claim 8, wherein the driving electrode is aligned in line with the third capacitor electrode.

13. The capacitor of claim 8, further comprising:
a first dielectric part provided at one lateral side of the first capacitor electrode,
a second dielectric part provided at one lateral side of the second capacitor electrode, and
a third dielectric part provided on the third capacitor electrode.

14. The capacitor of claim 13, wherein surfaces of the first to third dielectric part are exposed through the receiving groove.

15. The capacitor of claim 13, wherein the third capacitor electrode comprises a first sub-electrode part and a second sub-electrode part, and
wherein the first sub-electrode part has a thickness thinner than that of the second sub-electrode part.

16. The capacitor of claim 15, wherein the third dielectric part comprises a first sub dielectric part and a second sub-dielectric part,
wherein the first sub-dielectric part is directly provided on a top surface of the first sub electrode part, and
wherein the second sub-dielectric part is directly provided on a top surface of the second sub electrode part.

* * * * *